United States Patent
Ohshima

(10) Patent No.: US 7,457,089 B2
(45) Date of Patent: Nov. 25, 2008

(54) LOAD DRIVING DEVICE WITH DIAGNOSING UNIT FOR OVERCURRENT DETECTOR

(75) Inventor: Shunzou Ohshima, Kosai (JP)

(73) Assignee: Yazaki Corporation, Tokyo (JP)

( * ) Notice: Subject to any disclaimer, the term of this patent is extended or adjusted under 35 U.S.C. 154(b) by 65 days.

(21) Appl. No.: 11/593,020

(22) Filed: Nov. 6, 2006

(65) Prior Publication Data
US 2007/0103832 A1    May 10, 2007

(30) Foreign Application Priority Data
Nov. 8, 2005   (JP) ............................. P2005-323439

(51) Int. Cl.
*H02H 3/00*   (2006.01)
(52) U.S. Cl. ............................. 361/86; 361/100; 324/500
(58) Field of Classification Search ................... 361/86, 361/93.1, 100, 18; 324/500, 509
See application file for complete search history.

(56) References Cited

U.S. PATENT DOCUMENTS

| | | | | |
|---|---|---|---|---|
| 5,909,112 A | * | 6/1999 | Kiyota et al. ............... | 323/315 |
| 6,934,139 B2 | * | 8/2005 | Kumagai et al. ............ | 361/103 |
| 7,149,065 B2 | * | 12/2006 | Baldwin et al. ............. | 361/42 |
| 2006/0001687 A1 | * | 1/2006 | Bush et al. .................. | 347/19 |
| 2006/0187604 A1 | * | 8/2006 | Ohshima .................... | 361/100 |
| 2006/0268484 A1 | * | 11/2006 | Thurk et al. ................ | 361/93.1 |

* cited by examiner

*Primary Examiner*—Michael J Sherry
*Assistant Examiner*—Christopher J Clark
(74) *Attorney, Agent, or Firm*—Sughrue Mion, PLLC

(57) ABSTRACT

A load driving device for controlling a driving and a stop of a load through on/off switching of a semiconductor device under the control of a driving circuit, includes an overcurrent detecting unit that compares, with a prescribed judgment voltage, an inter-electrode voltage which is generated when a current flows between a first electrode and a second electrode of the semiconductor device, and judges that an overcurrent is flowing through the semiconductor device when the inter-electrode voltage is higher than the judgment voltage, and a diagnosing unit that performs a diagnosis as to whether the overcurrent detecting unit is operating normally in a state that the semiconductor device is a on-state. When the diagnosing unit judges that the overcurrent detecting unit is not operating normally, the diagnosing unit outputs an instruction signal for turning off the semiconductor device, to the driving circuit.

7 Claims, 7 Drawing Sheets

LOAD DRIVING DEVICE WITH DIAGNOSING UNIT FOR OVERCURRENT DETECTOR

BACKGROUND OF THE INVENTION

The present invention relates to a load driving device with a function of interrupting a circuit in the event of an overcurrent. In particular, the invention relates to a load driving device with a self-diagnosing function of detecting a failure in an overcurrent detecting function.

For example, in load driving devices for driving a load such as a lamp or a motor provided in a vehicle, a MOSFET as an electronic switch is provided between the battery and the load and the driving and the stop of driving of the load are controlled by turning on or off the MOSFET. They are provided with an overcurrent detecting function to protect circuit components of the load, MOSFET, and electrical wires when an overcurrent flows through the load by detecting it immediately.

FIG. 7 shows an exemplary circuit which is known as such a load driving device having an overcurrent detecting function.

As shown in FIG. 7, this load driving device is provided with a series circuit of a battery VB, a MOSFET T101 (hereinafter referred to simply as "FET"), and a load 101 such as a lamp or a motor.

A driver 102 is connected to the gate of the FET T101. When a drive signal is output from the driver 102, the FET T101 is turned on and the output voltage of the battery VB is applied to the load 101 to drive it.

The drain (voltage: V1) of the FET T101 is grounded via a series circuit of resistors R101 and R102, and the connecting point (voltage V4) of the resistors R101 and R102 is connected to the plus-side input terminal of a comparator CMP101. The source (voltage: V2) of the FET T101 is connected to the minus-side input terminal of the comparator CMP101. A term "1K" shown under the reference symbol R101 in FIG. 7 means that the resistance of the resistor R101 is 1 kΩ. And the same applies to the other resistors. That is, the resistance of the resistor R102 is 150 kΩ.

Resistors R103, R104, and R105 are provided parallel with the resistor R102, and their resistance values are set at 150 kΩ, 75 kΩ, and 37.5 kΩ, respectively. The resistors R103, R104, and R105 are grounded via FETs T102, T103, and T104, respectively.

Next, the operation of the above-configured load driving device will be described. When a drive signal is output from the driver 102, the FET T101 is turned on and a current ID flows along a path of the battery VB, the FET T101, and the load 101. The load 101 is driven being supplied with power in this manner. A voltage VDS (inter-electrode voltage) which is the difference between the voltage V1 of the drain (first electrode) and the voltage V2 of the source (second electrode) of the FET T101 is the product of the load current ID and an on-resistance Ron of the FET T101. That is, Equation (1) holds.

$$VDS = V1 - V2 = Ron * ID \quad (1)$$

Since the resistance Ron is constant, the voltage VDS varies in proportion to the load current ID. Therefore, whether or not the load current ID is an overcurrent can be judged by monitoring the magnitude of the voltage VDS. This is done in the following manner. A voltage (V1-V4) across the resistor R101 is set as a judgment voltage. Occurrence of an overcurrent is detected through inversion of an output signal of the comparator CMP101 when the voltage VDS becomes higher than the judgment voltage (V1-V4), in other words, when the source voltage V2 of the FET T101 becomes lower than the voltage V4.

When all of the FETs T102-T104 are off, the voltage V4 is equal to a voltage obtained by dividing the voltage V1 between the resistors R101 and R102. Since the on-resistance of the FET T101 is usually about 5 mΩ and the load current ID is about 10 A in a normal state, the drain-source voltage VDS is equal to about 50 mV in a normal state. Based on this fact, the voltage V4 is set so that the voltage (V1-V4) becomes equal to about 100 mV. In the example of FIG. 7, when V1=14.5 V, the voltage (V1-V4) is given by the following Equation (2):

$$V1 - V4 = V1 * R101 / (R101 + R102) \quad (2)$$
$$= 14.5 * 1 / (1 + 150)$$
$$= 96 \text{ (mV)}$$

With the above setting, a relationship V4<V2 holds in an ordinary state. If an overcurrent occurs and the voltage V2 decreases to establish a relationship V4>V2, the output signal of the comparator CMP101 is inverted. The occurrence of the overcurrent is detected by detecting such inversion.

A rush current flows when driving of the load 101 is started. To prevent a rush current from being judged erroneously as an overcurrent, a control of changing the judgment voltage (V1-V4) is performed by supplying control signals A1-A3 to the FETs T102-T104. For example, if the FET T102 is turned on, the judgment voltage (V1-V4) is approximately doubled. If the FET T103 is turned on additionally, the judgment voltage (V1-V4) is approximately quadrupled. If the FET T104 is further turned on, the judgment voltage (V1-V4) is made about eight times greater than its original value. Controlling the FETs T102-T104 in this manner makes it possible to avoid such trouble that the circuit is interrupted erroneously due to a rush current or a normal variation of the load current ID.

In the above circuit configuration, if an on-failure occurs in at least one of the FETs T102-T104, that is, if at least one of the FETs T102-T104 is turned on for a certain reason though it should be kept off, the judgment voltage (V1-V4) is made two times or more greater than its normal-state value even in an ordinary state. In an ordinary operation, a control is performed so that all of the FETs T102-T104 are kept off. However, if the FET T102, for example, is turned on due to an on-failure, the judgment voltage (V1-V4) is made approximately two times greater than the value that would be obtained when the FET T102 were off.

If an overcurrent occurs in such a state, the overcurrent cannot be detected even if the voltage VDS is higher than the standard judgment value (i.e., the voltage VDS exceeds the judgment voltage that is set when all of the FETs T102-T104 are off). Proper protection cannot be given and the FET T101 may be broken or the lines may be burnt.

Even when an on-failure occurs in one or some of the FETs T102-T104, the failure cannot be found because no erroneous operation is caused as long as the load current ID that flows in an ordinary operation including a case of a rush current is concerned. The failure is found only after an overcurrent occurs actually due to short-circuiting or the like. That is, when an on-failure occurs in one or some of the FETs T102-T104, the failure does not appear until an overcurrent occurs actually due to short-circuiting or the like. Such a situation is not preferable from the fail-safe point of view.

As described above, the conventional load driving device is provided with not only the function of immediately detecting an overcurrent (current ID) flowing through the load but also the resistors R103-R105 and the FETs T102-T104 for preventing erroneous detection of a current flowing in a normal state such as a rush current. However, the conventional load driving device has the problem that the circuit cannot be protected reliably in the event of an overcurrent if an on-failure occurs in one or some of the FETs T102-T104.

The overcurrent protection circuit includes circuit elements and lines connecting those in addition to the circuit elements for the judgment voltage setting. If a failure occurs in those circuit elements and lines, the circuit protecting function may be lost. Since the loss of the circuit protecting function does not appear immediately, a failure continues to exist for a long time once it occurs. As a result, the circuit may not be protected in the event of an overcurrent accident though its probability of occurrence is low.

SUMMARY OF THE INVENTION

The present invention has been made to solve the above problems in the art, and an object of the invention is therefore to provide a load driving circuit having a self-diagnosing function capable of performing a diagnosis as to whether or not an abnormality has occurred in an overcurrent detecting/protecting function.

In order to achieve the above object, according to the present invention, there is provided a load driving device for controlling a driving and a stop of a load through on/off switching of a semiconductor device under the control of a driving circuit, comprising:

an overcurrent detecting unit that compares, with a prescribed judgment voltage, an inter-electrode voltage which is generated when a current flows between a first electrode and a second electrode of the semiconductor device, and judges that an overcurrent is flowing through the semiconductor device when the inter-electrode voltage is higher than the judgment voltage; and a diagnosing unit that performs a diagnosis as to whether the overcurrent detecting unit is operating normally in a state that the semiconductor device is a on-state, wherein when the diagnosing unit judges that the overcurrent detecting unit is not operating normally, the diagnosing unit outputs an instruction signal for turning off the semiconductor device, to the driving circuit.

In the above configuration, a diagnosis as to whether or not the overcurrent detecting unit is operating normally is performed while the semiconductor device is the on-state. If it is judged that an abnormality has occurred in the overcurrent detecting unit, the semiconductor device is turned off to stop the driving of the load. This makes to possible to prevent trouble that the driving of the load is continued in a state that the overcurrent detecting unit has an abnormality. As a result, when an overcurrent has occurred, the circuit can be protected reliably by cutting off the semiconductor device.

Preferably, the overcurrent detecting unit includes a comparing unit which compares the inter-electrode voltage with the judgment voltage. When the diagnosing unit performs the diagnosis of the overcurrent detecting unit, the diagnosing unit switches so as to change the judgment voltage to a diagnosis judgment voltage which is smaller than the inter-electrode voltage of the semiconductor device obtained when an ordinary current flows through the load, and judges that an abnormality has occurred in the overcurrent detecting unit when the comparing unit judges that the inter-electrode voltage is lower than or equal to the diagnosis judgment voltage.

In the above configuration, when the diagnosing unit diagnoses the overcurrent detecting unit, the judgment voltage to be compared with the inter-electrode voltage is changed to the diagnosis judgment voltage which is lower than an ordinary judgment voltage. Therefore, the output signal of the comparing unit is inverted if no abnormality has occurred in the overcurrent detecting unit, and is not inverted if an abnormality has occurred in the overcurrent detecting unit. Whether or not an abnormality has occurred in the overcurrent detecting unit can be judged by judging whether the output signal of the comparing unit is inverted or not. Whether or not an unduly small current is flowing through the load can also be detected.

Preferably, the overcurrent detecting unit includes a comparing unit which compares the inter-electrode voltage with the judgment voltage. When the diagnosing unit performs the diagnosis of the overcurrent detecting unit, the diagnosing unit generates an added voltage by adding a prescribed voltage to the inter-electrode voltage, the comparing unit compares the added voltage instead of the inter-electrode voltage with the judgment voltage. The diagnosing unit judges that an abnormality has occurred in the overcurrent detecting unit when the comparing unit judges that the added voltage is lower than or equal to the judgment voltage.

In the above configuration, when the diagnosing unit diagnoses the overcurrent detecting unit, the added voltage obtained by adding the prescribed voltage to the inter-electrode voltage is supplied to the comparing unit instead of the inter-electrode voltage and the comparing unit compares the added voltage with the judgment voltage. Therefore, when no abnormality has occurred in the overcurrent detecting unit, the added voltage is higher than the judgment voltage and hence the output signal of the comparing unit is inverted. On the other hand, when an abnormality has occurred in the overcurrent detecting unit, the output signal of the comparing unit is not inverted. Whether or not an abnormality has occurred in the overcurrent detecting unit can be judged by judging whether the output signal of the comparing unit is inverted or not. In this diagnosing method, if the added voltage is set higher than or equal to a standard judgment voltage, the overcurrent detecting unit is judged normal even if the load current is unduly small. This diagnosing method is applicable to a case that it is considered that the semiconductor device need not be cut off even in the event of an unduly small load current because it is not a factor of causing such trouble as heat generation. The second embodiment is applicable to such a case.

Preferably, the overcurrent detecting unit includes a comparing unit which compares the inter-electrode voltage with the judgment voltage. When the diagnosing unit performs the diagnosis of the overcurrent detecting unit, the diagnosing unit switches so as to change the judgment voltage to a diagnosis judgment voltage which is smaller than the inter-electrode voltage of the semiconductor device obtained when an ordinary current flows through the load, and generates an added voltage by adding a prescribed voltage to the inter-electrode voltage. The comparing unit compares the added voltage instead of the inter-electrode voltage with the diagnosis judgment voltage. The diagnosing unit judges that an abnormality has occurred in the overcurrent detecting unit when the comparing unit judges that the added voltage is lower than or equal to the diagnosis judgment voltage.

In the above configuration, when the diagnosing unit diagnoses the overcurrent detecting unit, the judgment voltage is changed to the diagnosis judgment voltage which is lower than an ordinary judgment voltage and the added voltage obtained by adding the prescribed voltage to the inter-electrode voltage is supplied to the comparing unit instead of the inter-electrode voltage. Therefore, the output signal of the comparing unit is inverted if no abnormality has occurred in the overcurrent detecting unit, and is not inverted if an abnormality has occurred in the overcurrent detecting unit. Whether or not an abnormality has occurred in the overcurrent detecting unit can be judged by judging whether the output signal of the comparing unit is inverted or not. When an unduly small current is flowing through the load, the output signal of the comparing unit is inverted. Therefore, only whether or not an abnormality has occurred in the overcurrent detecting unit can be detected, that is, occurrence of an unduly small load current is not detected.

Here, it is preferable that, the overcurrent detecting unit has a function of detecting an overcurrent when the comparing unit judges that the inter-electrode voltage is higher than the judgment voltage in an ordinary state excluding a diagnosis state. The overcurrent detecting unit includes a prohibiting unit which disables the function of detecting the overcurrent on the basis of an output of the comparing unit while the diagnosing unit diagnoses the overcurrent detecting unit.

In the above configuration, when the diagnosing unit diagnoses the overcurrent detecting unit, the prohibiting unit disables the overcurrent judgment which is based on the output signal of the comparing unit. This makes it possible to prevent erroneous overcurrent detection caused by an inversion of the output signal of the comparing unit during a diagnosis.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE PREFERRED EMBODIMENTS

Figure 1:
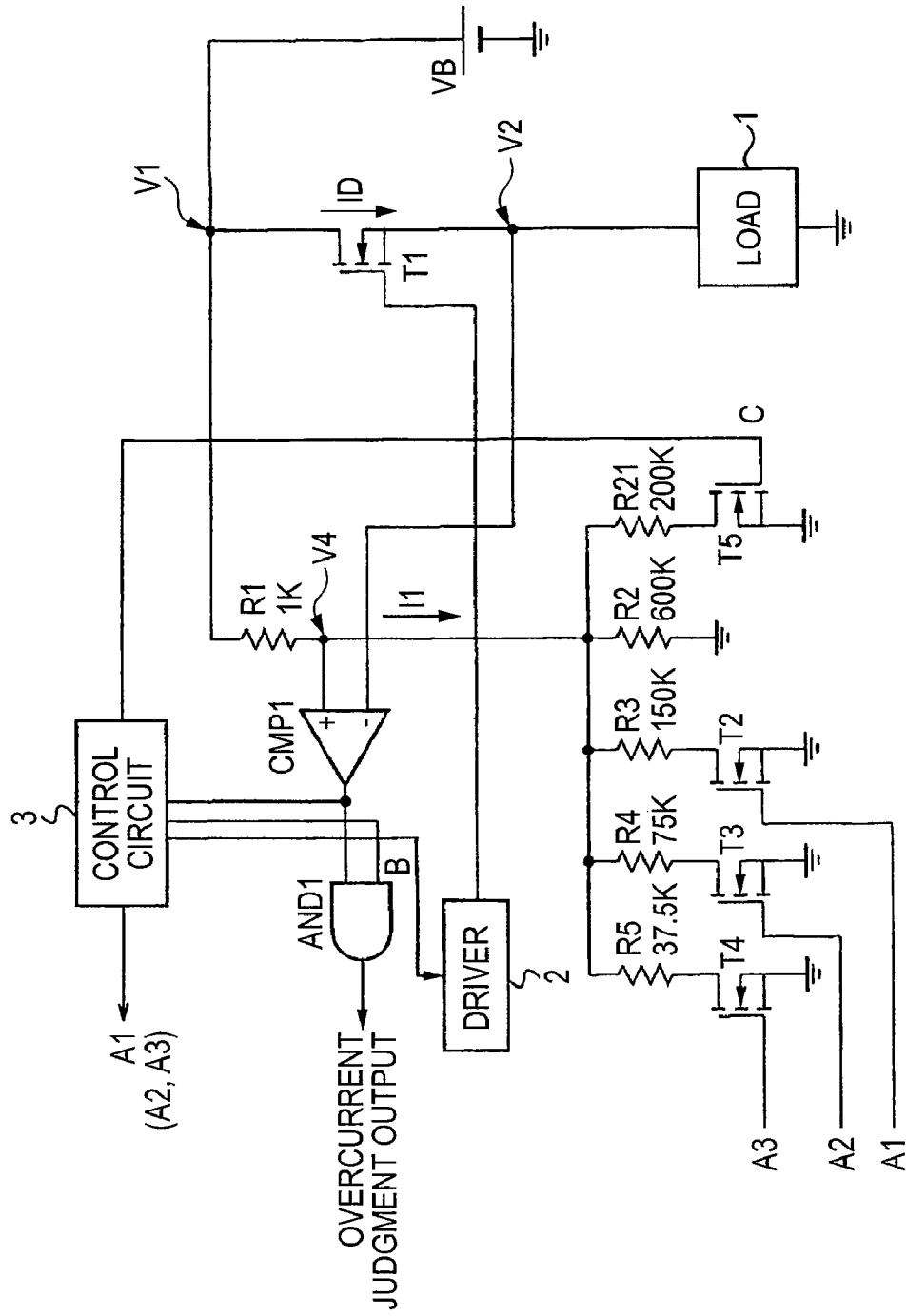
FIG. 1 is a circuit diagram showing the configuration of a load driving device having a self-diagnosing function according to a first embodiment of the invention.

Embodiments of the present invention will be hereinafter described with reference to the drawings. FIG. 1 is a circuit diagram showing the configuration of a load driving device having a self-diagnosing function according to a first embodiment of the invention.

As shown in FIG. 1, this load driving device is provided with a series circuit of a battery VB, a MOSFET T1 (semiconductor device; hereinafter referred to simply as "FET"), and a load 1 such as a lamp or a motor.

A driver (driving circuit) 2 is connected to the gate of the FET T1. When a drive signal is output from the driver 2, the FET T1 is turned on and the output voltage of the battery VB is applied to the load 1 to drive it.

The drain (first electrode; voltage: V1) of the FET T1 is grounded via a series circuit of resistors R1 and R2, and the connecting point (voltage V4) of the resistors R1 and R2 is connected to the plus-side input terminal of a comparator CMP 1. The source (second electrode; voltage: V2) of the FET T1 is connected to the minus-side input terminal of the comparator CMP1. A term "1K" shown under the reference symbol R1 in FIG. 1 means that the resistance of the resistor R1 is 1 k$\Omega$. And the same applies to the other resistors. That is, the resistance of the resistor R2 is 600 k$\Omega$.

Two branch lines branch off the output terminal of the comparator CMP1. One branch line is connected to one input terminal of an AND circuit AND1 (a prohibiting unit) and the other branch line is connected to a control circuit 3 (a overcurrent detecting unit, a diagnosing unit). The other input terminal of the AND circuit AND1 is connected to the control circuit 3.

Resistors R3, R4, and R5 are provided parallel with the resistor R2, and their resistance values are set at 150 k$\Omega$, 75 k$\Omega$, and 37.5 k$\Omega$, respectively. The resistors R3, R4, and R5 are grounded via FETs T2, T3, and T4, respectively.

Figure 7:
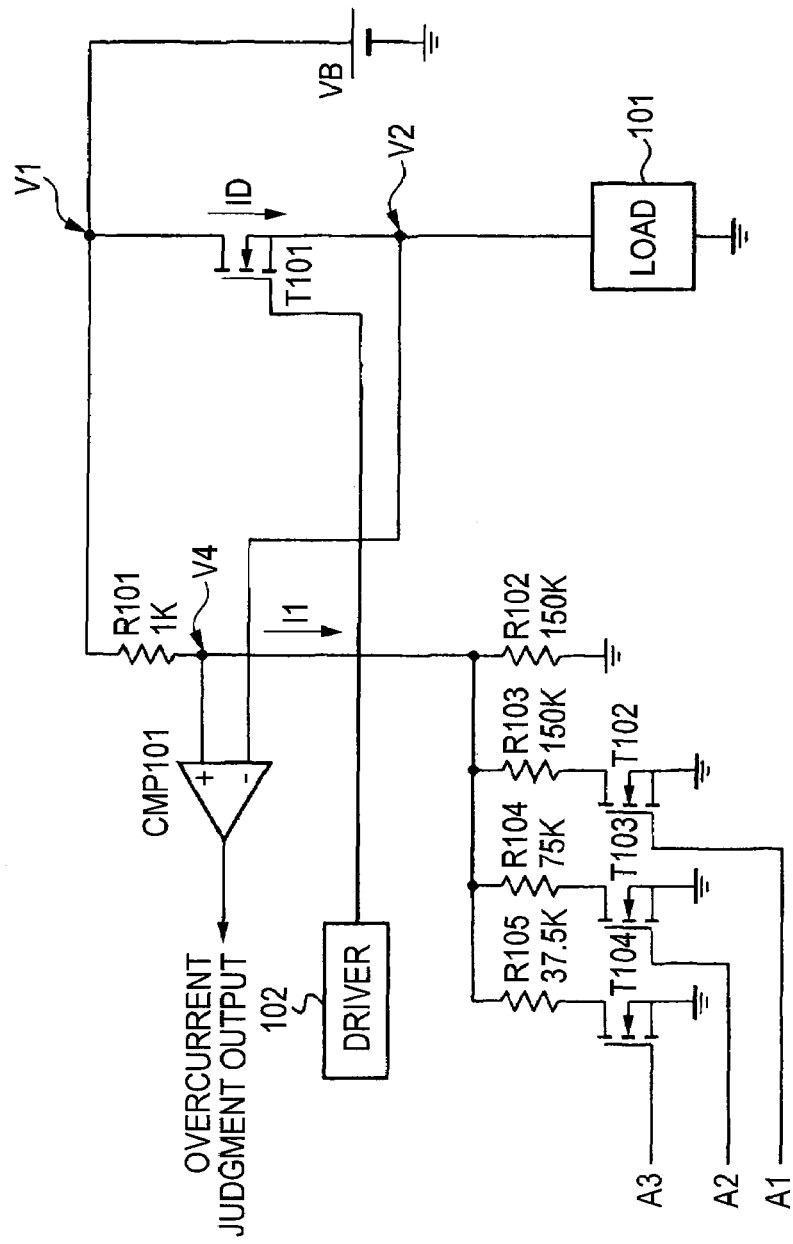
FIG. 7 is a circuit diagram showing the configuration of a conventional load driving device.

A resistor R21 is connected in parallel to the resistor R2 and is grounded via an FET T5. The resistance values of the resistors R2 and R21 are 600 k$\Omega$ and 200 k$\Omega$, respectively, and hence their combined resistance (parallel connection) is equal to 150 k$\Omega$, which is equal to the resistance of the resistor R102 of the conventional device of FIG. 7.

The gates of the FETs T2-T5 are connected to the control circuit 3, and the FETs T2-T5 are on/off-controlled according to control signals A1-A3 and C which are output from the control circuit 3.

Next, the operation of the above-configured load driving device will be described.

<Ordinary Operation>

When a drive signal is output from the driver 2 and supplied to the gate of the FET T1, the FET T1 is turned on and a current ID flows along a path of the battery VB, the FET T1, and the load 1. The load 1 is driven being supplied with power in this manner. A voltage VDS (inter-electrode voltage) which is the difference between the drain voltage V1 and the source voltage V2 of the FET T1 is the product of the load current ID and an on-resistance Ron of the FET T1. That is, Equation (1) holds as described in the "Background Art" section.

$$VDS=V1-V2=Ron*ID \qquad (1)$$

Since the resistance Ron is constant, the voltage VDS varies in proportion to the load current ID. Therefore, whether or not the load current ID is an overcurrent can be judged by monitoring the magnitude of the voltage VDS. This is done in the following manner. A voltage (V1-V4) across the resistor R1 is set as a judgment voltage. Occurrence of an overcurrent is detected through inversion of an output signal of the comparator CMP1 when the voltage VDS becomes higher than the voltage (V1-V4), in other words, when the source voltage V2 of the FET T1 becomes lower than the voltage V4.

When all of the FETs T2-T4 are off and the FET T5 is on, the voltage V4 is equal to a voltage obtained by dividing the voltage V1 between the resistors R1 (1k$\Omega$) and the combined resistor (150 k$\Omega$) of the resistors R2 and R21 (parallel connection). Since the on-resistance of the FET T1 is usually about 5 m$\Omega$ and the load current ID is about 10 A in a normal state, the drain-source voltage VDS is equal to about 50 mV in a normal state. Based on this fact, the voltage V4 is set so that the judgment voltage (V1-V4) becomes equal to about 100 mV. In the example of FIG. 1, when V1=14.5 V, the voltage (V1-V4) is given by the following Equation (2).

$$V1 - V4 = V1 * R1 / (R1 + R2 \| R21) \quad (2)$$
$$= 14.5 * 1 / (1 + 150)$$
$$= 96 \, (\text{mV})$$

where R2∥R21 means the combined resistance of the resistors R2 and R21 (parallel connection).

With the above setting, a relationship V4<V2 holds in an ordinary state. If an overcurrent occurs and the voltage V2 decreases to establish a relationship V4>V2, the output signal of the comparator CMP1 is inverted. The occurrence of the overcurrent is detected by detecting such inversion. Detecting inversion of the output signal of the comparator CMP1, the control circuit 3 outputs, to the driver 2, an instruction signal for turning off the FET T1.

A rush current flows when driving of the load 1 is started. To prevent a rush current from being judged erroneously as an overcurrent, a control of changing the judgment voltage (V1-V4) is performed by the control circuit 3's outputting control signals A1-A3 to the FETs T2-T4. For example, if the FET T2 is turned on, the judgment voltage (V1-V4) is approximately doubled. If the FET T3 is turned on additionally, the judgment voltage (V1-V4) is approximately quadrupled. If the FET T4 is further turned on, the judgment voltage (V1-V4) is made about eight times greater than its original value. Controlling the FETs T2-T4 in this manner makes it possible to avoid such trouble that the circuit is interrupted erroneously due to a rush current or a normal variation of the load current ID.

A specific operation will be described below. It is assumed that a control signal B which is supplied to the one input terminal of the AND circuit AND1 is of an H level. First, if the output signal of the comparator CMP1 is inverted (i.e., an overcurrent is detected) in a state that all of the FETs T2-T4 are off and the FET T5 is on, all of the FETs T2-T4 are turned on. In this case, the judgment voltage (V1-V4) is made eight times greater than the ordinary-state value. If an overcurrent is still detected in this state, the FET T1 is cut off immediately with a recognition that too large an overcurrent is flowing due to dead short-circuiting or the like.

If no overcurrent is detected any more (i.e., the output signal of the comparator CMP1 returns to the original state) by making the judgment voltage (V1-V4) eight times greater than the ordinary-state value, only the FET T4 is turned off after a lapse of a prescribed time. As a result, the judgment voltage (V1-V4) is made four times greater than the ordinary-state value. If an overcurrent is detected again in this state, the FET T1 is cut off. On the other hand, if no overcurrent is detected, the FET T3 is turned off after a lapse of a prescribed time, whereby the judgment voltage (V1-V4) is made two times greater than the ordinary-state value.

If an overcurrent is detected again in this state, the FET T1 is cut off. If no overcurrent is detected, the FET T2 is turned off after a lapse of a prescribed time. If an overcurrent is detected in this state, the FET T1 is cut off. On the other hand, if no overcurrent is detected, the present state is maintained with a recognition that the overcurrent is due to an ordinary current variation like a rush current. That is, the driving of the load 1 is continued with the FETs T2-T4 kept off.

Since the FETs T2-T4 are on/off-controlled individually in the above manner, when too large a current as would flow in the event of a dead short-circuiting flows through the FET T1, the circuit is interrupted immediately, whereby the FET T1, the load 1, and the lines can be protected. Furthermore, for a current that would occur in an ordinary state such as a rush current is not judged as an overcurrent and hence a erroneous interruption that would otherwise result from it can be avoided.

<Diagnostic operation>

Figure 2:
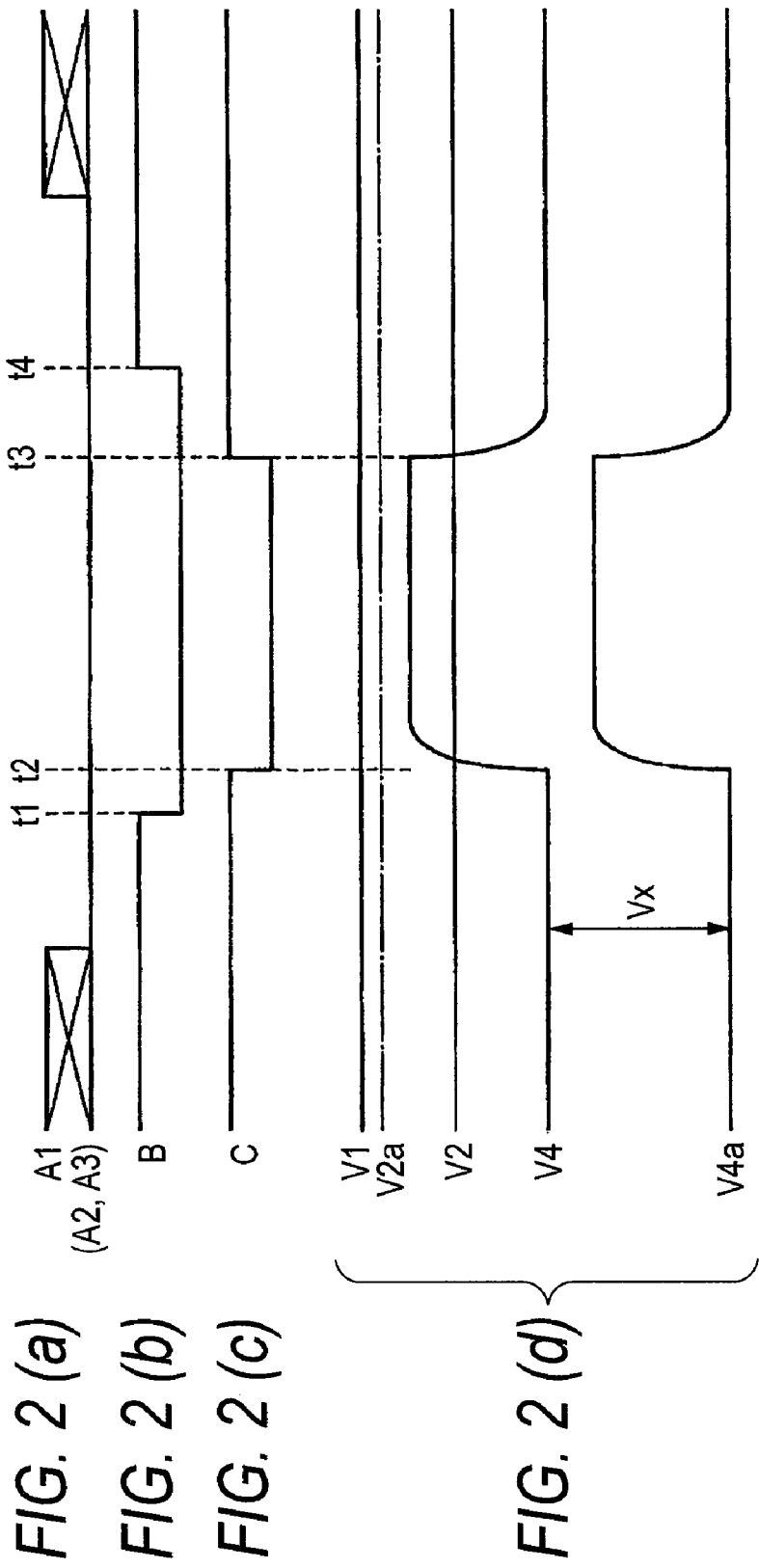
FIG. 2 is a timing chart showing variations of various control signals and voltages of the load driving device according to the first embodiment.

Next, an operation of a diagnosis as to whether a failure has occurred in the overcurrent detection circuit will be described. FIG. 2 is a timing chart showing variations of the control signals for the respective FETs T2-T5 which are output from the control circuit 3, the control signal B which is input to the one input terminal of the AND circuit AND1, and various voltages. FIG. 2(a) shows the control signals A1-A3, FIG. 2(b) shows the control signal B, and FIG. 2(c) shows the control signal C. FIG. 2(d) shows variations of the voltage V1, a voltage V2a (described later), the voltage V2, the voltage V4, and a voltage V4a (described later). A diagnosis is performed when all of the control signals A1-A3 are off (i.e., at the L level) and the judgment voltage is in the standard state.

Upon a start of a diagnosis, the level of the control signal B shown in FIG. 2(b) is switched from "H" to "L" at time t1, whereby the level of the signal that is supplied to the one input terminal of the AND circuit AND1 (a prohibiting unit) is made "L." Therefore, the level of the output signal of the AND circuit AND1 is fixed to "L." That is, output of an overcurrent judgment signal is prohibited even if it is generated by the comparator CMP1.

In this state, the level of the control signal C shown in FIG. 2(c) is switched from "H" to "L" at time t2, whereby the FET T5 is turned off and the resistor R21 is interrupted. The voltage V4 comes to be generated by the series circuit of the resistors R1 and R2. Since switching is made from the combined resistance (150 kΩ) of the resistors R2 and R21 (parallel connection) to the resistor R2 (600 kΩ), the judgment voltage (V1-V4) decreases rapidly (to a diagnosis judgment value). That is, the voltage V4 increases rapidly as shown in FIG. 2(d). The voltage V4 exceeds the voltage V2, whereby the output signal of the comparator CMP1 is inverted. This does not result in detection of an overcurrent because the AND circuit AND1 is prohibited from outputting an overcurrent judgment signal. Therefore, occurrence of an overcurrent is not detected.

The control circuit 3 detects whether or not the output signal of the comparator CMP1 has been inverted. If detecting inversion, the control circuit 3 judges that the overcurrent detection circuit including the FETs T2-T4 is operating normally. The level of the control signal C is returned from "L" to "H" at time t3, whereupon the voltage V4 becomes lower than the voltage V2 (the judgment voltage changes from the diagnosis judgment value to the ordinary judgment value). The level of the control signal B is returned from "L" to "H" at time t4, whereby the ordinary overcurrent detecting function is restored. The above-described diagnostic function is performed at prescribed intervals by performing the above manipulations of time t1 to t4 cyclically.

If an on-failure occurs in at least one of the FETs T2-T4, during a diagnosis at least one of the resistors R3-R5 is made effective though the resistor R21 is interrupted. The combined resistance of the resistors R2-R5 (parallel connection) becomes smaller than 150 kΩ. Therefore, the voltage V4 becomes lower than the value in an ordinary operation (i.e., the value obtained when the resistors R2 and R21 are connected to each other in parallel). That is, as shown in FIG. 2(d), the voltage V4a which is a voltage V4 in this situation is lower, by a voltage Vx, than the value that is obtained when only the resistor R2 is effective. Therefore, the voltage V4a does not exceed the voltage V2 and the output signal of the comparator CMP1 is not inverted.

Therefore, if the output signal of the comparator CMP1 is not inverted in the period of time t2 to t3, the control circuit 3 can judge that the overcurrent detection circuit is not functional. If the control circuit 3 detects, plural times (e.g., three times) consecutively, that the output signal of the comparator CMP1 is not inverted in the processing of time t1 to t4 which is performed cyclically, the control circuit 3 judges that the overcurrent detection circuit is certainly dysfunctional. To prevent such trouble as may cause a vehicle fire in the worst case, the control circuit 3 outputs a stop signal to the driver 2 and thereby cuts off the FET T1. Furthermore, the control circuit 3 announces the occurrence of an abnormality in the overcurrent detecting function using a lamp, a buzzer, or the like (not shown).

As described above, in the load driving apparatus having a self-diagnosing function according to the embodiment, the resistor R102 for voltage division in an ordinary state (see FIG. 7) is replaced by the parallel connection of the resistors R2 and R21 as shown in FIG. 1 and their combined resistance is set the same as the resistance of the resistor R102 (150 kΩ). During a diagnosis, the FET T5 is turned off, whereby the judgment voltage (V1-V4) is made the diagnosis judgment value which is smaller than the ordinary judgment value and the output signal of the comparator CMP1 is inverted.

The above circuit can also detect a state that the current flowing through the load 1 is unduly small. This will be described below. When the current flowing through the load 1 (i.e., load current ID) is smaller than in an ordinary operation for a certain reason, the voltage VDS becomes low according to Equation (1). That is, the source voltage V2 of the FET T1 (i.e., the voltage V2a shown in FIG. 2(d)) becomes higher than in an ordinary state. In this case, the voltage V4 does not exceed the voltage V2a even if the FET T5 is turned off to increase the voltage V4. Since the output signal of the comparator CMP1 is not inverted, the control circuit 3 judges that the overcurrent detecting function is lost. This indicates that an abnormality that the current flowing through the load 1 is unduly small can also be detected by making the judgment voltage (V1-V4) lower than in the standard state by turning off the FET T5.

The above discussion can be interpreted as follows. Let ΔV4 represent an increase of the voltage V4 that occurs when the FET T5 is turned off. Confirming that the relationship (V1-V4) <VDS is established if the voltage V4 is increased by ΔV4 in a state that the judgment voltage (V1-V4) is in the standard state (i.e., a control is made so that the FETs T2-T4 are turned off) assures that the overcurrent detecting function works surely when the voltage VDS is increased by ΔV4 or more by a line failure or the like. In the above description, an on-failure in one or some of the FETs T2-T4 is a factor of impairing the overcurrent protecting function. On the other hand, a confirmation that the output signal of the comparator CMP1 is inverted if the voltage V4 is increased by ΔV4 means a confirmation that not only are the FETs T2-T4 normal but also all of the components and lines involved in the overcurrent detecting function operate normally.

Figure 3:
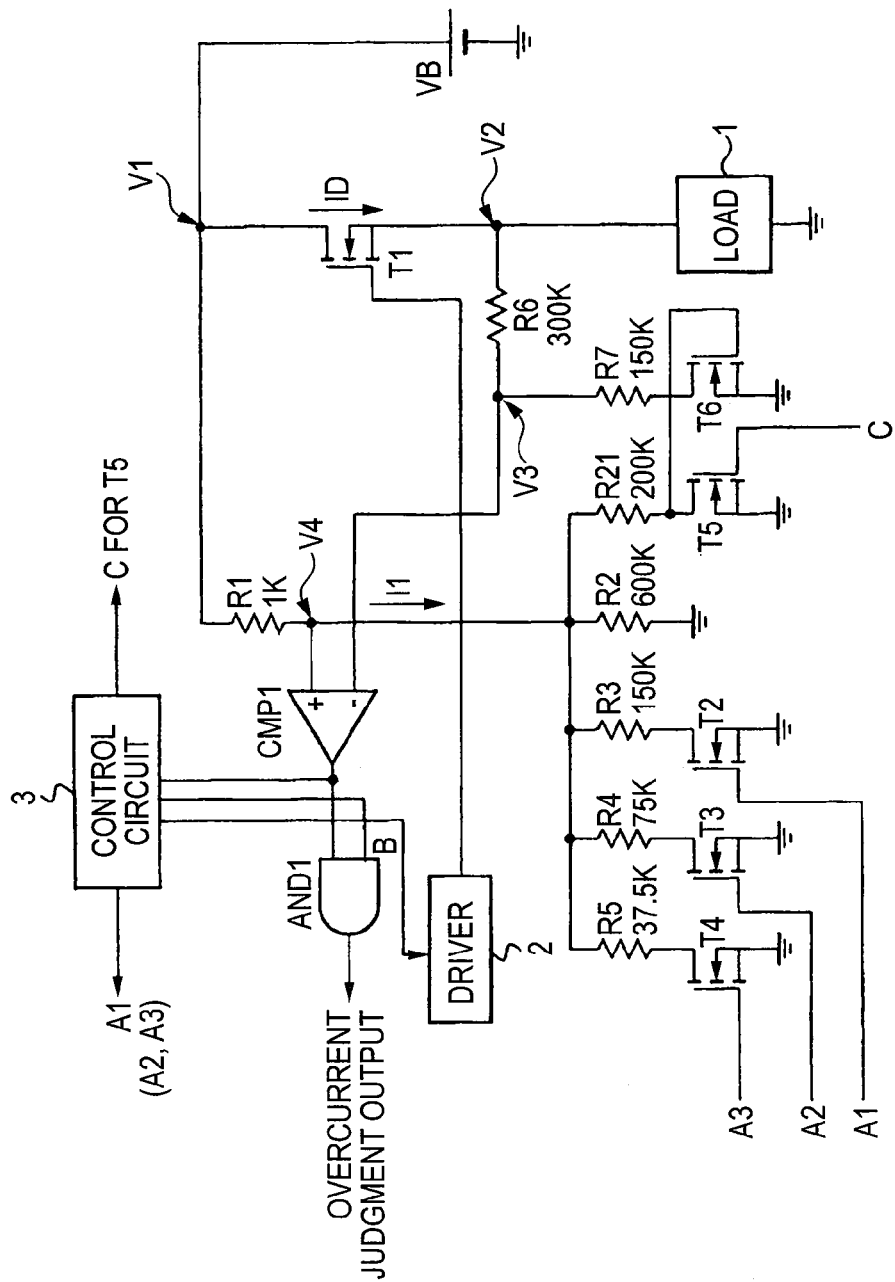
FIG. 3 is a circuit diagram showing the configuration of a load driving device having a self-diagnosing function according to a second embodiment of the invention.

Next, a second embodiment of the invention will be described. FIG. 3 is a circuit diagram showing the configuration of a load driving device according to the second embodiment. The circuit according to this embodiment is the same in configuration as the circuit of FIG. 1 except that the former is equipped with resistors R6 and R7 and an FET T6.

More specifically, in the load driving device according to the second embodiment, the resistor R6 is provided between the source of the FET T1 and the minus-side input terminal of the comparator CMP1 and a series circuit of the resistor R7 and the FET T6 is provided between one end of the resistor R6 and the ground. The gate of the FET T6 is connected to the source of the FET T5.

Figure 4:
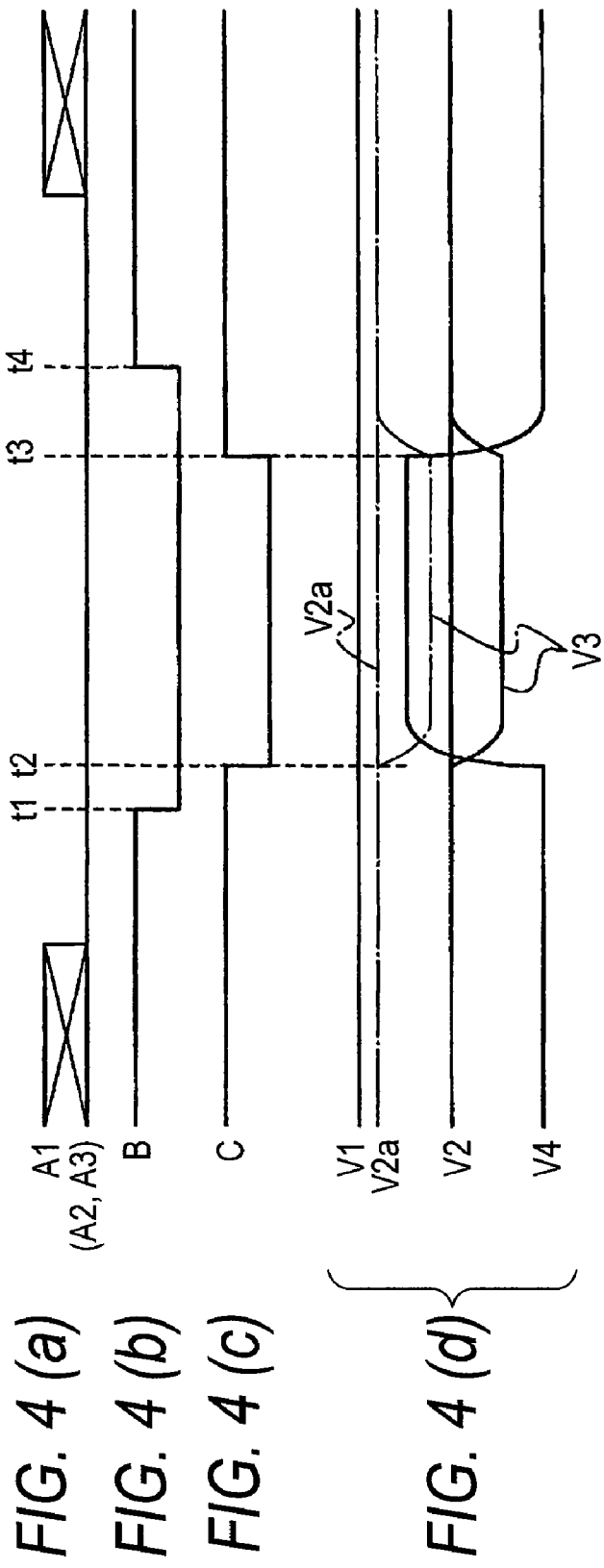
FIG. 4 is a timing chart showing variations of various control signals and voltages of the load driving device according to the second embodiment.

Next, the operation of the second embodiment will be described. In an ordinary state, the load driving device according to the second embodiment operates in the same manner as that according to the first embodiment. A diagnostic operation will be described below with reference to a timing chart of FIG. 4.

In a diagnostic operation, the level of the control signal B is changed to "L" at time t1, whereby the level of the output signal of the AND circuit AND1 is fixed to "L." A control signal C is input to the gate of the FET T5 at time t2, whereby the FET T5 is turned off. As a result, the voltage V4 increases as in the case of the first embodiment. As shown in FIG. 4(d), the voltage V4 increases in a period from time t2 to t3 and exceeds the voltage V2. Therefore, the output signal of the comparator CMP1 is inverted, and it is detected that the overcurrent protecting function is normal including the fact that no on-failure has occurred in the FETs T2-T4.

At the same time, the FET T6 is turned on at time t2, whereon a current flows through the resistors R6 and R7 and a voltage drop occurs across the resistor R6. A voltage V3 which is lower than the voltage V2 is supplied to the minus input terminal of the comparator CMP1. That is, the voltage (V1-V3) is an added voltage obtained by adding a prescribed voltage to the voltage VDS (inter-electrode voltage).

Therefore, even when an unduly small current flows through the load 1 and the voltage V2 (i.e., a voltage V2a shown in FIG. 4(d)) becomes higher than the ordinary value, in the period from time t2 to t3, the voltage V3 which is lowered by the voltage drop across the resistor R6 becomes lower than the voltage V4 and hence the output signal of the comparator CMP1 is inverted. This prevents a phenomenon that the output signal of the comparator CMP1 is not inverted due to an unduly small current flowing through the load 1.

In the first embodiment, in a diagnostic operation, the load current ID being unduly small is detected through non-inversion of the output signal of the comparator CMP1. In contrast, in the second embodiment, such an event can be excluded from subjects of detection because the output signal of the comparator CMP1 is inverted when the load current ID is unduly small. It is possible to consider that the FET T1 need not be cut off even in the event of an unduly small load current because, in contrast to an overcurrent, an unduly small current is not a safety-related problem. The second embodiment is applicable to such a case.

Figure 5:
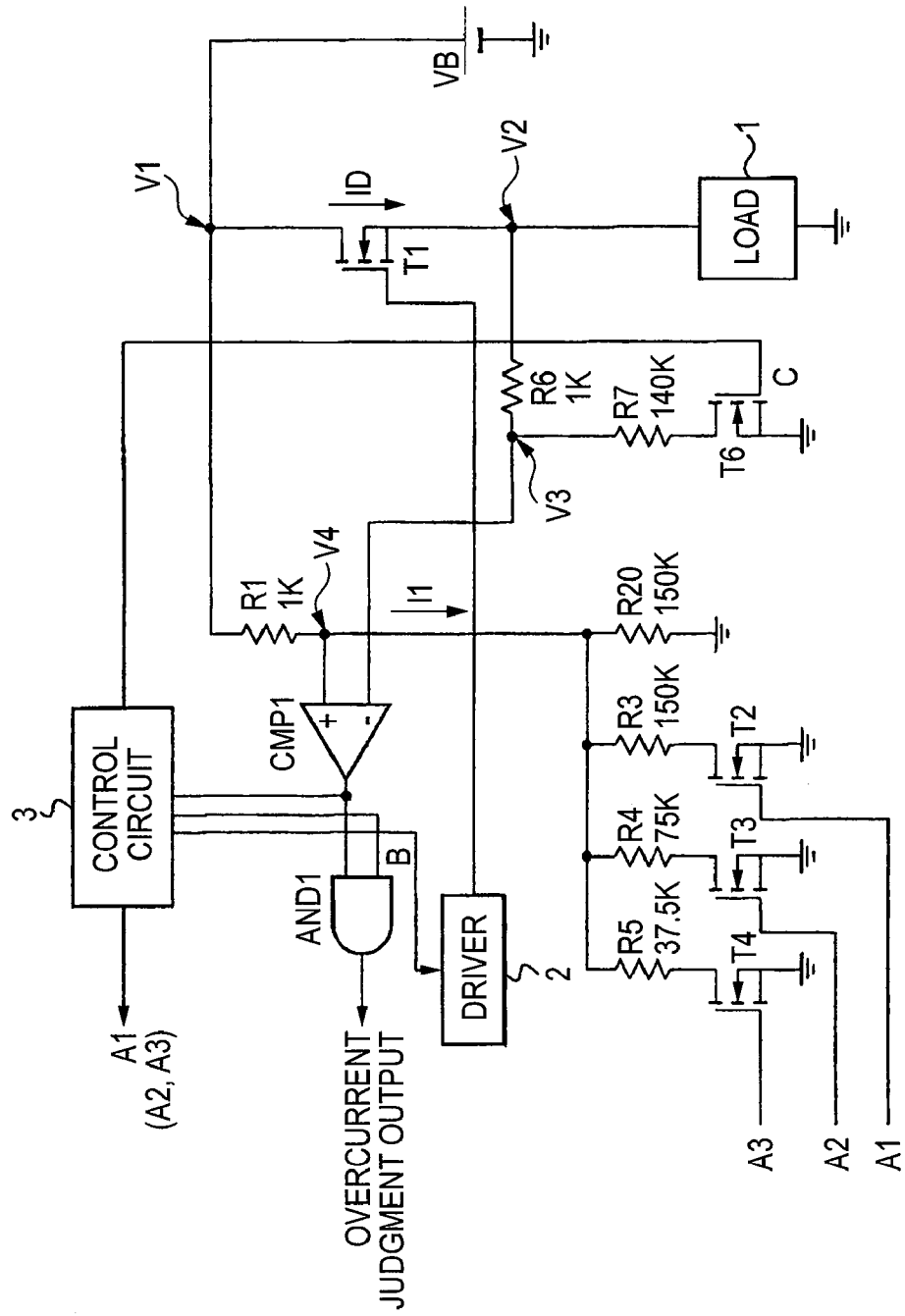
FIG. 5 is a circuit diagram showing the configuration of a load driving device having a self-diagnosing function according to a third embodiment of the invention.

Next, a third embodiment of the invention will be described. FIG. 5 is a circuit diagram showing a load driving device according to the third embodiment. The circuit of this embodiment is different from the circuit of FIG. 3 in that the resistor R21, the FET T5 are removed and the resistor R2 (600 kΩ) is replaced by a resistor R20 (150 kΩ), and that a control signal C is supplied to the gate of the FET T6. The control signal C of this embodiment is an inverted version of the control signal shown in FIG. 4(c). Furthermore, to change the magnitude of the voltage (V2-V3), the resistance values of the resistors R6 and R7 are changed. In the circuit of FIG. 5, in a diagnostic operation, the voltage V4 is not changed and only a manipulation of adding a voltage to the voltage VDS is performed. That is, unlike in the first embodiment, the judgment voltage (V1-V4) is not changed to the diagnosis judgment value which is smaller than the ordinary judgment value and only the processing of obtaining an added voltage by adding a prescribed voltage to the voltage VDS is performed.

Figure 6:
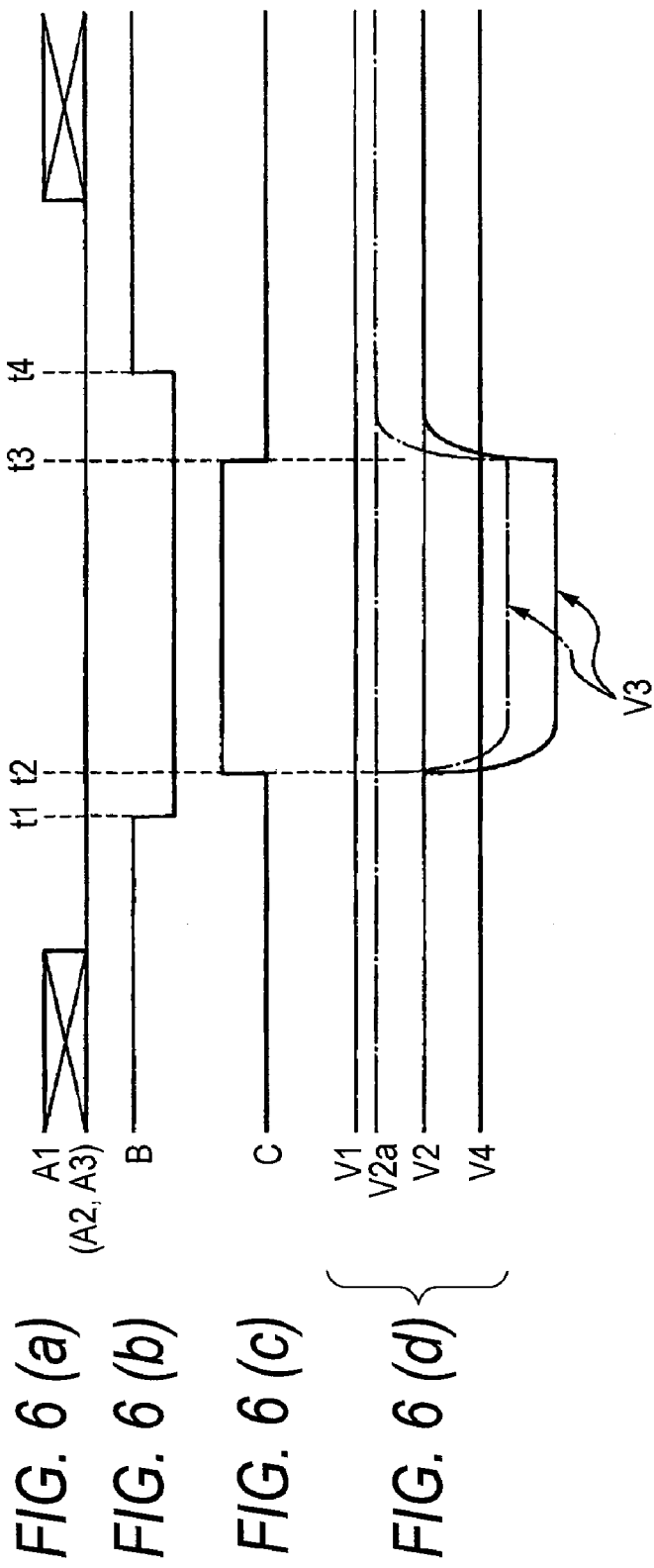
FIG. 6 is a timing chart showing variations of various control signals and voltages of the load driving device according to the third embodiment.

The operation of the third embodiment will be described with reference to a timing chart of FIG. 6. The example of FIG. 6 is the same as the examples of FIGS. 2 and 4 in that a diagnostic operation is performed in a state that the control signals A1-A3 are at the L level and that in the period from time t1 to t4 the control signal B is set to the L level to fix the output level of the AND circuit AND1 to "L."

The level of the control signal C is changed from "L" to "H" at time t2, whereby the FET T6 is turned on, whereupon a current flows through the resistor R6 and a voltage drop occurs there.

The resistance values of the resistors R6 and R7 are set so that the magnitude of the voltage drop (V2-V3) is somewhat larger than the standard judgment voltage (V1-V4). As a result, if the overcurrent detection circuit is functioning normally, in the period from t2 to t3 a relationship V3<V4 is established and hence the output signal of the comparator CMP1 is inverted. The output signal of the comparator CMP1 is inverted even for a voltage V2a which is obtained when the load current ID is unduly smaller than the normal value. That is, the feature of the second embodiment that an unduly small load current is not a subject of detection is realized in the third embodiment with a simpler circuit configuration.

The load driving devices having a self-diagnosing function according to the invention have been described above in the form of illustrated embodiments. However, the invention is not limited to those embodiments. Each individual part can be replaced by a desired circuit having the same function.

A diagnosis as to whether or not an overcurrent protecting function incorporated in a semiconductor switch is performed at prescribed intervals while the semiconductor switch is conductive. In the event of an abnormality, the semiconductor switch is cut off, whereby an accident such as heat generation or a fire due to a failure in the semiconductor switch can be prevented reliably. As a result, the reliability of the semiconductor switch is made equivalent to a conventional switching mechanism consisting of a fuse and a relay. The overcurrent protecting function and the switching function can thus be implemented by a semiconductor switch.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japan Patent Application No. 2005-323439 filed on Nov. 11, 2005, the contents of which are incorporated herein for reference.

What is claimed is:

1. A load driving device for controlling a driving and a stop of a load through on/off switching of a semiconductor device under the control of a driving circuit, comprising:
    an overcurrent detecting unit that compares, with a prescribed judgment voltage, an inter-electrode voltage which is generated when a current flows between a first electrode and a second electrode of the semiconductor device, and judges that an overcurrent is flowing through the semiconductor device when the inter-electrode voltage is higher than the judgment voltage; and
    a diagnosing unit that performs a diagnosis as to whether the overcurrent detecting unit is operating normally in a state that the semiconductor device is in an on-state,
    wherein when the diagnosing unit judges that the overcurrent detecting unit is not operating normally, the diagnosing unit outputs an instruction signal for turning off the semiconductor device, to the driving circuit.

2. The load driving device according to claim 1, wherein the overcurrent detecting unit includes a comparing unit which compares the inter-electrode voltage with the judgment voltage; and
    wherein when the diagnosing unit performs the diagnosis of the overcurrent detecting unit, the diagnosing unit switches so as to change the judgment voltage to a diagnosis judgment voltage which is smaller than the inter-electrode voltage of the semiconductor device obtained when an ordinary current flows through the load, and the diagnosing unit judges that an abnormality has occurred in the overcurrent detecting unit when the comparing unit judges that the inter-electrode voltage is lower than or equal to the diagnosis judgment voltage.

3. The load driving device according to claim 1, wherein the overcurrent detecting unit includes a comparing unit which compares the inter-electrode voltage with the judgment voltage; and
    wherein when the diagnosing unit performs the diagnosis of the overcurrent detecting unit, the diagnosing unit generates an added voltage by adding a prescribed voltage to the inter-electrode voltage, the comparing unit compares the added voltage instead of the inter-electrode voltage with the judgment voltage; and
    wherein the diagnosing unit judges that an abnormality has occurred in the overcurrent detecting unit when the comparing unit judges that the added voltage is lower than or equal to the judgment voltage.

4. The load driving device according to claim 1, wherein the overcurrent detecting unit includes a comparing unit which compares the inter-electrode voltage with the judgment voltage; and
    wherein when the diagnosing unit performs the diagnosis of the overcurrent detecting unit, the diagnosing unit switches so as to change the judgment voltage to a diagnosis judgment voltage which is smaller than the inter-electrode voltage of the semiconductor device obtained when an ordinary current flows through the load, and generates an added voltage by adding a prescribed voltage to the inter-electrode voltage, the comparing unit compares the added voltage instead of the inter-electrode voltage with the diagnosis judgment voltage; and
    wherein the diagnosing unit judges that an abnormality has occurred in the overcurrent detecting unit when the comparing unit judges that the added voltage is lower than or equal to the diagnosis judgment voltage.

5. The load driving device according to claim 2, wherein the overcurrent detecting unit has a function of detecting an overcurrent when the comparing unit judges that the inter-electrode voltage is higher than the judgment voltage in an ordinary state excluding a diagnosis state; and
    wherein the overcurrent detecting unit includes a prohibiting unit which disables the function of detecting the overcurrent on the basis of an output of the comparing unit while the diagnosing unit diagnoses the overcurrent detecting unit.

6. The load driving device according to claim 3, wherein the overcurrent detecting unit has a function of detecting an overcurrent when the comparing unit judges that the inter-electrode voltage is higher than the judgment voltage in an ordinary state excluding a diagnosis state; and
    wherein the overcurrent detecting unit includes a prohibiting unit which disables the function of detecting the overcurrent on the basis of an output of the comparing unit while the diagnosing unit diagnoses the overcurrent detecting unit.

7. The load driving device according to claim 4, wherein the overcurrent detecting unit has a function of detecting an overcurrent when the comparing unit judges that the inter-electrode voltage is higher than the judgment voltage in an ordinary state excluding a diagnosis state; and wherein the overcurrent detecting unit includes a prohibiting unit which disables the function of detecting the overcurrent on the basis of an output of the comparing unit while the diagnosing unit diagnoses the overcurrent detecting unit.

* * * * *